US011107513B2

(12) United States Patent
Lee et al.

(10) Patent No.: US 11,107,513 B2
(45) Date of Patent: Aug. 31, 2021

(54) SPIN-ORBIT TORQUE MAGNETIC MEMORY DEVICE USING ALTERNATING CURRENT

(71) Applicant: KOREA UNIVERSITY RESEARCH AND BUSINESS FOUNDATION, Seoul (KR)

(72) Inventors: Kyung-Jin Lee, Seoul (KR); Gyungchoon Go, Seoul (KR); Seung-Jae Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/878,920

(22) Filed: May 20, 2020

(65) Prior Publication Data

US 2020/0286537 A1    Sep. 10, 2020

Related U.S. Application Data

(63) Continuation of application No. PCT/KR2019/000878, filed on Jan. 22, 2019.

(30) Foreign Application Priority Data

Jan. 30, 2018    (KR) ........................ 10-2018-0011547

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1655* (2013.01); *G11C 11/1697* (2013.01);
(Continued)

(58) Field of Classification Search
CPC . G11C 11/161; G11C 11/1673; G11C 13/004; G11C 11/15; G11C 11/16;
(Continued)

(56) References Cited

U.S. PATENT DOCUMENTS 10,229,724 B1 * 3/2019 El Baraji ............ H01F 10/3286

FOREIGN PATENT DOCUMENTS

KR    10-2004-0039493 A    5/2004
KR    10-2008-0080386 A    9/2008
(Continued)

OTHER PUBLICATIONS

International Search Report dated May 1, 2019 in corresponding International Patent Application No. PCT/KR2019/000878 (3 pages in English, 3 pages in Korean).

*Primary Examiner* — Thong Q Le
(74) *Attorney, Agent, or Firm* — NSIP Law (57) ABSTRACT

A magnetic memory according to one embodiment of the present invention comprises: a magnetic tunnel junction comprising a free layer, a reference layer, and a tunnel barrier layer disposed between the free layer and the reference layer; a first conductive line disposed adjacent to the free layer; and a second conductive line disposed adjacent to the free layer and intersecting the first conductive line. A magnetization switching method of the magnetic memory comprises the steps of: applying an alternating current-type first current having a first frequency to the first conductive line; and applying an alternating current-type second current having the first frequency to the second conductive line. The free layer performs magnetization reversal, using the first current and the second current, and the magnetic tunnel junction is disposed on an intersection point between the first conductive line and the second conductive line.

15 Claims, 9 Drawing Sheets

(51) Int. Cl.
 *H01F 10/32* (2006.01)
 *H01L 27/22* (2006.01)
 *H01L 43/02* (2006.01)

(52) U.S. Cl.
 CPC ....... *H01F 10/329* (2013.01); *H01F 10/3259* (2013.01); *H01F 10/3286* (2013.01); *H01L 27/228* (2013.01); *H01L 43/02* (2013.01)

(58) Field of Classification Search
 CPC ............ G11C 11/1659; G11C 11/1675; G11C 11/1693; G11C 13/0002; G11C 13/0064; G11C 13/0069; G11C 2013/0042; G11C 2013/0054; G11C 2013/0066; G11C 5/06
 USPC ...................................... 365/148, 158, 63, 66
 See application file for complete search history.

(56) References Cited

FOREIGN PATENT DOCUMENTS

| | | |
|---|---|---|
| KR | 10-2009-0040033 A | 4/2009 |
| KR | 10-2013-0124009 A | 11/2013 |
| KR | 10-2016-0133821 A | 11/2016 |
| KR | 10-2018-0061555 A | 6/2018 |

\* cited by examiner

SPIN-ORBIT TORQUE MAGNETIC MEMORY DEVICE USING ALTERNATING CURRENT

CROSS-REFERENCE TO RELATED APPLICATIONS

This application is a continuation of and claims priority to PCT/KR2019/000878 filed on Jan. 22, 2019, which claims priority to Korea Patent Application No. 10-2018-0011547 filed on Jan. 30, 2018, the entireties of which are both hereby incorporated by reference.

TECHNICAL FIELD

The present disclosure relates to a magnetic memory device and, more particularly, to a spin-orbit torque magnetic memory device which may significantly reduce critical current due to an effective magnetic field effect by the alternating current.

BACKGROUND

With the trend for high speed and low power consumption of electronic devices, memory devices incorporated therein are also required to have high-speed read and write operations and low operating voltages. To satisfy such a requirement, magnetic memory devices have been studied as storage devices. Since magnetic memory devices may have characteristics such as high-speed operations and/or non-volatility, they have been in the spotlight as next-generation memory devices.

A magnetic memory device is a memory device using a magnetic tunnel junction (MTJ). A magnetic tunnel junction includes two magnetic layers and a tunnel barrier layer interposed therebetween. Resistance of the magnetic tunnel junction varies depending on relative directions of magnetic moments of the two magnetic layers. Specifically, when the relative directions of the magnetic moments of the two magnetic layers are anti-parallel, the resistance of the magnetic tunnel junction may be increased. When the relative directions of the magnetic moments of the two magnetic layers are parallel, the resistance of the junction may be low. A magnetic memory device may read data using such a resistance difference of the magnetic tunnel junction.

SUMMARY

An aspect of the present disclosure is to provide a magnetic memory device having improved switching efficiency of a free layer.

An aspect of the present disclosure is to provide a writing method of a magnetic memory device having improved switching efficiency of a free layer.

Objectives addressed by the present disclosure are not limited to the above-described objectives, and other objectives, which are not described above, may be clearly understood by those skilled in the art through the following specification.

According to an aspect of the present disclosure, a magnetic memory includes a magnetic tunnel junction, including a free layer, a reference layer, and a tunnel barrier layer disposed between the free layer and the reference layer, a first conductive line disposed adjacent to the free layer, and a second conductive line disposed adjacent to the free layer and intersecting the first conductive line. A magnetization switching method of the magnetic memory includes applying AC-type first current having a first frequency to the first conductive line and applying AC-type second current having the first frequency to the second conductive line. The free layer performs magnetization reversal using the first current and the second current, and the magnetic tunnel junction is disposed on an intersection of the first conductive line and the second conductive line.

In example embodiments, the first conductive line and the second conductive line may be disposed in the same plane.

In example embodiments, a phase difference between the first current and the second current may be 90 degrees.

In example embodiments, a phase difference between the first current and the second current may be given depending on a magnetization direction of the free layer.

In example embodiments, the first frequency may be several hundreds of MHz to several tens of GHz.

In example embodiments, the free layer may have an easy axis of magnetization, perpendicular to a surface of the free layer, to have perpendicular magnetic anisotropy.

In example embodiments, the first conductive line and the second conductive line may include at least one of copper (Cu), tantalum (Ta), platinum (Pt), tungsten (W), gadolinium (Gd), bismuth (Bi), iridium (Ir), and combinations thereof.

According to an aspect of the present disclosure, a magnetic memory includes a plurality of first conductive lines extending in a first direction, a plurality of second conductive lines extending in a second direction perpendicular to the first direction, a plurality of magnetic tunnel junction elements, each including a free layer, a reference layer, and a tunnel barrier layer disposed between the free layer and the reference layer and respectively disposed on intersections between the first conductive lines and the second conductive lines, a first AC power supply providing first AC current to the first conductive lines, a second AC power supply providing second AC current to the second conductive lines, and bitlines extending parallel to the first conductive lines and connected to the reference layers of the magnetic tunnel junction elements arranged in the first direction.

In example embodiments, the first current and the second current may switch the free layer.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

A writing method of a magnetic memory device may be provided. The magnetic memory device includes a magnetic tunnel junction, including a reference layer, a free layer, and a tunnel barrier layer disposed therebetween, and a first conductive line and a second conductive line disposed adjacent to the free layer and intersecting each other. The first conductive line is configured such that an AC-type current flows therethrough, and the second conductive line is configured such that AC-type current flows therethrough. In the writing method of the magnetic memory device, AC-type current is applied to the first conductive line and the second line.

Example embodiments of the present disclosure are described herein with reference to accompanying drawings. The same reference numerals or the same reference designators may denote the same elements throughout the specification.

Hereinafter, example embodiments of the present disclosure will be described in the context of the current understanding of a spin-orbit interaction, a spin-orbit torque, a spin-transfer torque, and other physical phenomena. It will be appreciated by one of ordinary skill in the art that theoretical descriptions of operations of example embodiments are based on the current understanding of such physical phenomena. However, example embodiments are not dependent on a specific physical description.

Hereinafter, "in-plane" is substantially within or parallel to a plane of one or more layers or conductive line(s). Conversely, "perpendicular" corresponds to a direction, substantially perpendicular to one or more of the layers or conductive lines of the magnetic junction.

Figure 1A:
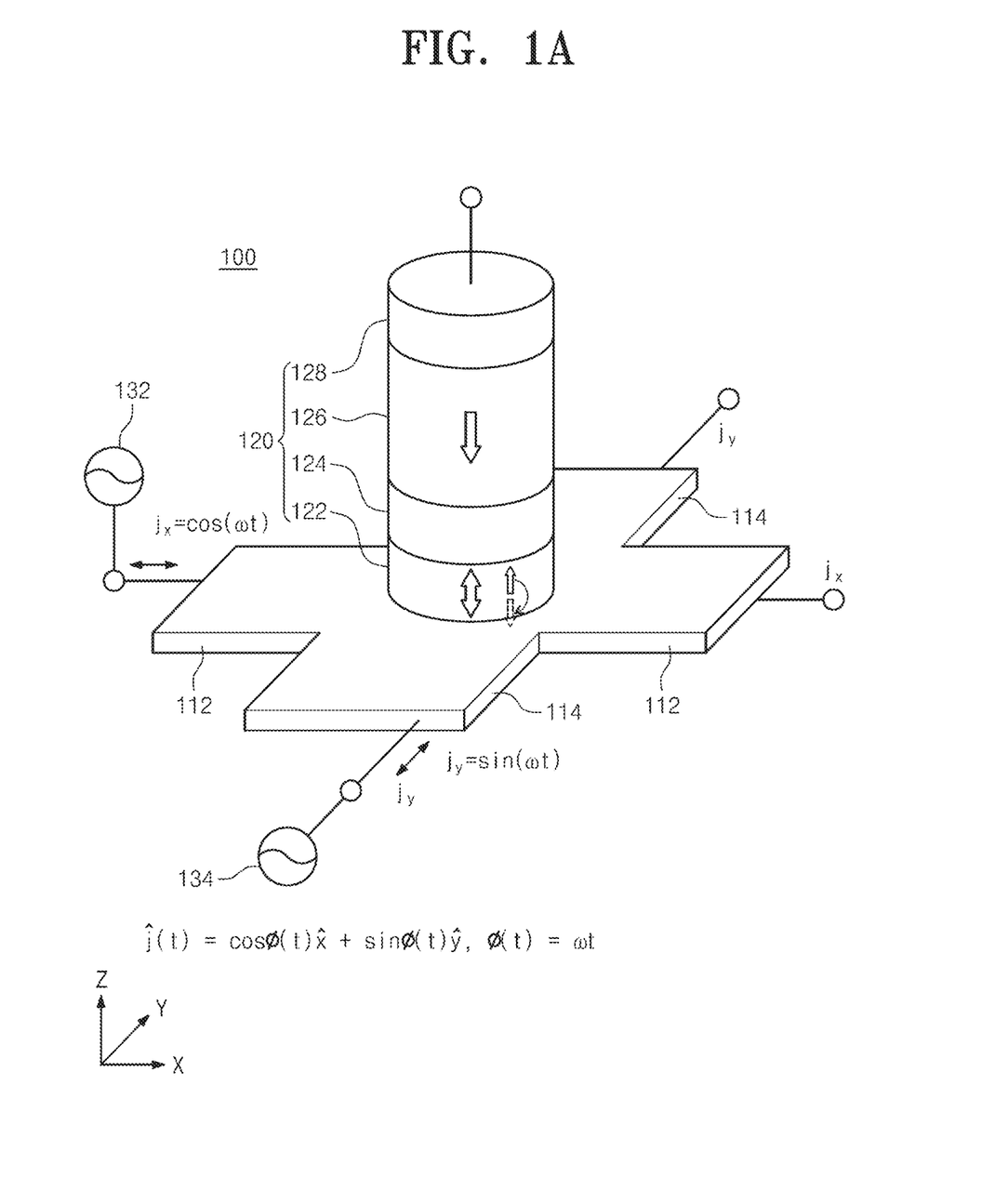
FIG. 1A is a conceptual diagram of a magnetic memory device according to an example embodiment of the present disclosure.

FIG. 1A is a conceptual diagram of a magnetic memory device according to an example embodiment of the present disclosure.

Figure 1B:
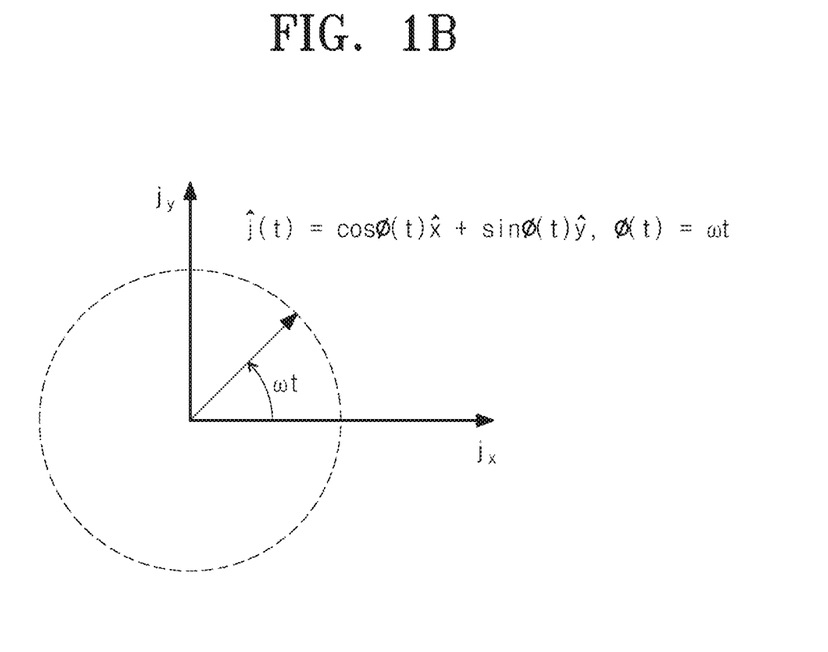
FIG. 1B is a phase graph showing the first current and second current in FIG. 1A.

FIG. 1B is a phase graph showing the first current and second current in FIG. 1A.

Figure 1C:
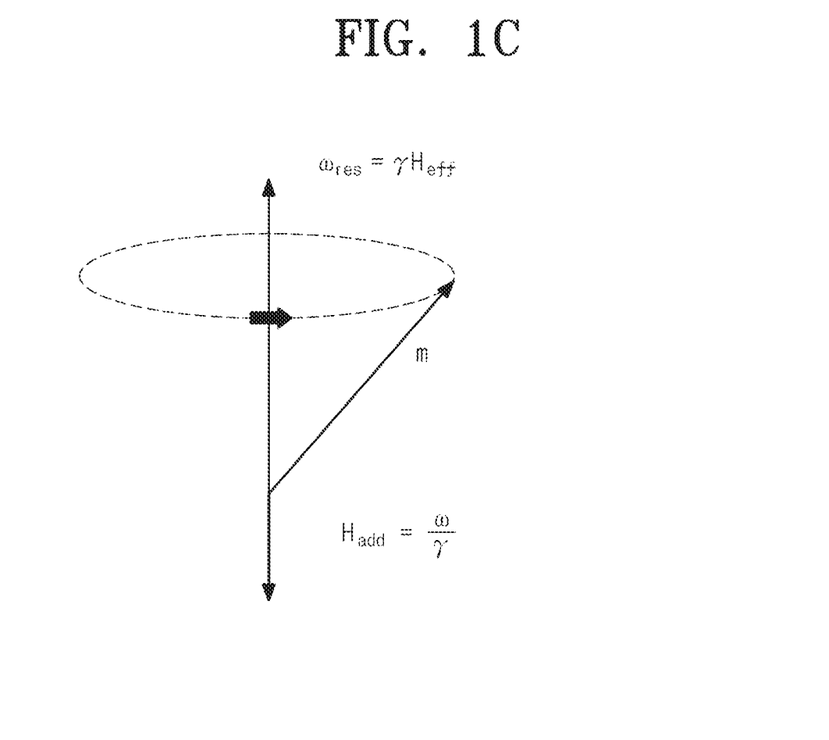
FIG. 1C is a graph showing an effective magnetic field of a vertical direction generated in a rotating coordinate system.

FIG. 1C is a graph showing an effective magnetic field of a vertical direction generated in a rotating coordinate system.

Figure 2:
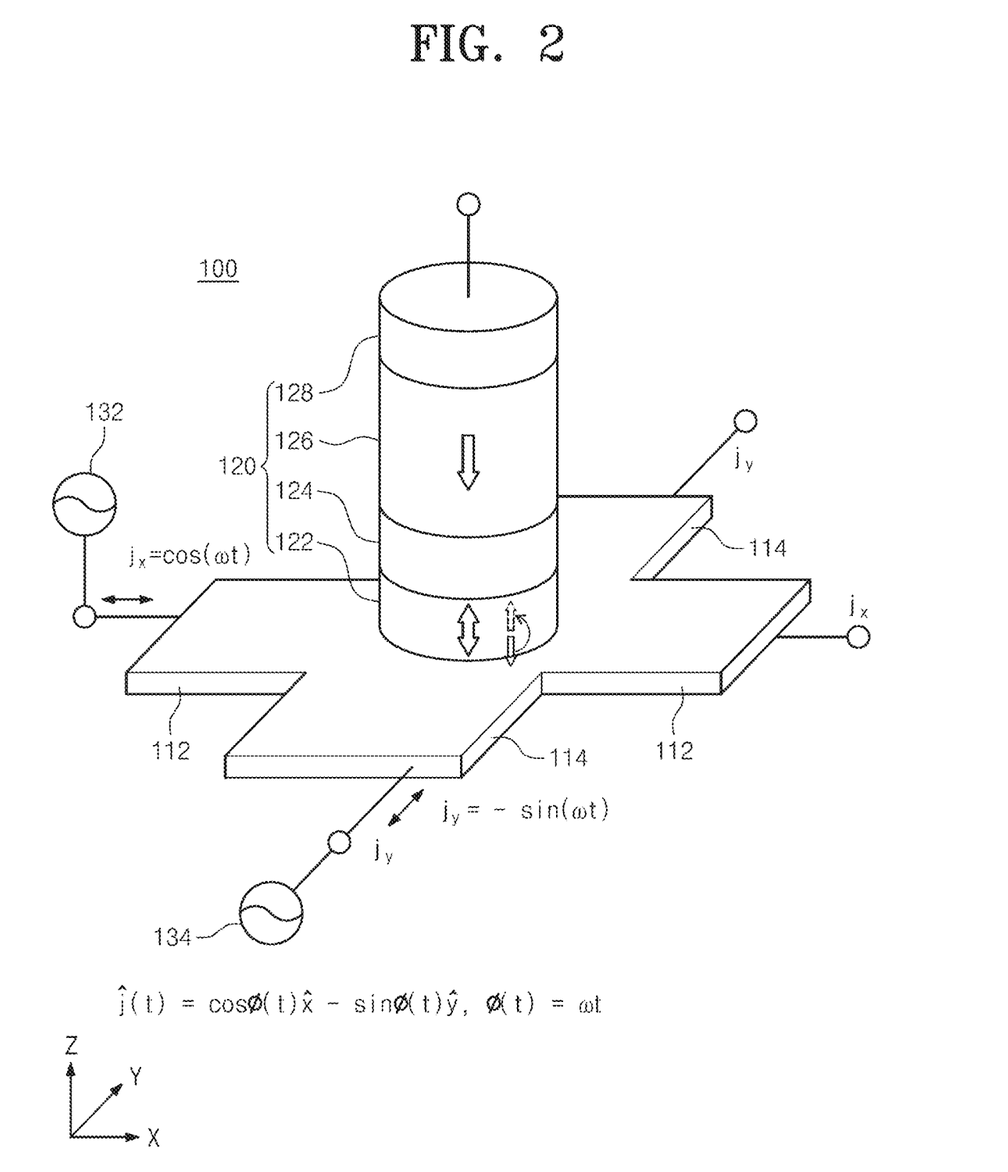
FIG. 2 is a conceptual diagram illustrating phases of first current and second current in a magnetic memory device according to an example embodiment of the present disclosure.

FIG. 2 is a conceptual diagram illustrating phases of first current and second current in a magnetic memory device according to an example embodiment of the present disclosure.

Referring to FIGS. 1 and 2, a magnetic memory device 100 may include a magnetic tunnel junction 120, a first conductive line 112, and a second conductive line 114. The magnetic tunnel junction 120 includes a free layer 122, a reference layer 126, and a tunnel barrier layer 124 disposed between the free layer 122 and the reference layer 126. The first conductive line 112 is disposed adjacent to the free layer 122. The second conductive line 114 is disposed adjacent to the free layer 122 and intersects the first conductive line 112. A magnetization switching method of the magnetic memory 100 includes applying AC-type first current $j_x$, having a first frequency, to the first conductive line 112 and applying AC-type second current $j_y$, having the first frequency, to the second conductive line 114. The free layer 122 performs magnetization reversal using the first current and the second current. The magnetic tunnel junction 120 is disposed on an intersection of the first conductive line 112 and the second conductive line 114.

When the first current having a first angular frequency ω is injected into the first conductive line 112 and a second current having the first angular frequency ω is injected into the second conductive line 114, a total current vector may rotate with time in a location in which the magnetic tunnel junction 120 is disposed.

When a problem is viewed from the viewpoint of a rotating coordinate system such as a phase of a total current vector, a problem of alternating current turns into a problem of direct current. From the viewpoint of the rotating coordinate system, an effective magnetic field in a vertical direction corresponding to rotation angular velocity of rotation emerges. That is, an effect of alternating current turns into a problem of direct current in a system in which an effective magnetic field is present in the vertical direction. In this case, magnetization of a free layer may be significantly easily reversed due to an effect of the effective magnetic field in the vertical direction.

An equation of motion of the magnetization of the free layer 122, performed by a spin-orbit torque, is given by Equation 1 below.

$$\frac{\partial m}{\partial t} = -\gamma m \times H_{K,\mathit{eff}}\hat{z} + \alpha m \times \frac{\partial m}{\partial t} + \gamma c_J m \times (m \times (\hat{j}(t) \times \hat{z})) + \gamma d_J m \times (\hat{j}(t) \times \hat{z}),$$

$$c_J = \frac{\hbar}{2e}\frac{\theta_{SH}J}{M_S d}, \quad d_J = \beta\frac{\hbar}{2e}\frac{\theta_{SH}J}{M_S d}$$

Equation 1 where m denotes a unit magnetization vector of the free layer 122, γ denotes a gyro-magnetic constant, $H_{K,\mathit{eff}}$ denotes an effective magnetic anisotropic magnetic field of the free layer 122, α denotes a Gilbert damping constant, and $\hat{j}$ is a direction of applied current.

In the spin transfer torque device according to the present disclosure, $\hat{j}$ linearly or circularly oscillates with time, which is different from a conventional method.

In Equation 1, $c_J$ and $d_j$ denote spin-orbit spin transfer torques generated by a spin hall effect and correspond to a damping-like torque and a field-like torque, respectively, $\theta_{SH}$ denotes a spin hall angle indicating a spin hall effect.

In Equation 1, β is an amount called a non-adiabaticity parameter and denotes a ratio between the damping-like torque and the field-like torque ($\beta = d_j/c_j$).

In Equation 1, J denotes applied current density, e (=1.6×$10^{-19}$C) denotes the charge of electron, $M_S$ is the amount of saturated magnetization of a free magnetic layer, and d denotes a thickness of the free magnetic layer. Coordinate directions x, y, and z of Equation 1 are illustrated in FIG. 1.

When rotating alternating current is used, an equation of motion of magnetization in a rotating coordinate system, such as a phase of injected current, is approximated to Equation 2 below under the assumption of small attenuation.

$$\frac{\partial m}{\partial t} \approx -\gamma m \times \left(H_{K,eff} - \frac{\omega}{\gamma}\right)\hat{z} + \gamma \alpha m \times (m \times H_{K,eff}\hat{z}) + \gamma c_J m \times (m \times (\hat{j} \times \hat{z})) + \gamma d_J m \times (\hat{j} \times \hat{z}).$$

Equation 2 where ω denotes angular velocity of the rotating coordinate system. The angular velocity of the rotating coordinate system is the same as an angular frequency of the phase of the injected current. In Equation 2, a direction $\hat{j}$ of the applied current does not change with time.

Referring to Equation 2, an effective magnetic field ω/γ additionally emerges in the vertical direction. When the effective magnetic field ω/γ in the vertical direction is in a direction in which a resonant frequency is decreased, it helps switching. Since the effective magnetic field in the vertical direction helps the switching, a switching threshold current may be significantly lower than an existing threshold current. Moreover, an additional external magnetic field for switching is not required.

The first conductive line 112 and the second conductive line 114 may be materials causing a spin hall effect or a Rashba effect. When the first current flows through the first conductive line 112, spin polarization occurs in a direction, perpendicular to a direction in which the first conductive line 112 extends, and spin current propagates in a direction of the free layer (a Z-axis direction).

The first conductive line 112 may have a line shape extending in an X direction. The second conductive line 114 may have a line shape intersecting the first conductive line 112. For example, the second conductive line 114 may have a line shape extending in a Y direction.

The first conductive line 112 and the second conductive line 114 may intersect each other at one point, and may be connected to each other. For example, the first conductive line 112 and the second conductive line 114 may be disposed on the same plane (for example, an X-Y plane).

The magnetic tunnel junction 120 may be disposed on an intersection of the first and second conductive lines 112 and 114. The free layer 122 of the magnetic tunnel junction 120 may be adjacent to the intersection of the first and second conductive lines 112 and 114. Accordingly, the free layer 122 may be interposed between the tunnel barrier layer 124 and the intersection of the conductive lines 112 and 114.

Each of the first and second conductive lines 112 and 114 may include a material exhibiting a strong spin-orbit interaction. For example, each of the first and second conductive lines 112 and 114 includes at least one of copper (Cu), tantalum (Ta), platinum (Pt), tungsten (W), gadolinium (Gd), bismuth (Bi), and iridium (Ir).

The magnetic memory device 100 may include a first AC power supply 132, configured such that the first current $J_x$ flows through the first conductive line 112, and a second AC power supply 134 configured such that second current $J_y$ flows through the second conductive line 114.

For example, the first current $J_x$ may be current flowing in a plane of the first conductive line 112, and the second current $J_y$ may be current flowing in a plane of the second conductive line 114.

When the first current $J_x$ flows in an X direction or a −X direction, charge carriers having a spin-polarized in a Y direction or a −Y direction may be incident into the free layer 122. In addition, when the second current $J_y$ flows in the Y direction or the −Y direction, charge carriers having spins polarized in the X direction or the −X direction may be incident into the free layer 122. This may result from a spin-orbit interaction (for example, a spin hall effect) occurring on the conductive lines 112 and 114. The charge carriers, having such a polarized spin, may apply a torque to a magnetic moment of the free layer 122.

When a magnetization direction of the free layer 122 is a negative z-axis direction, a rotation direction of the current may be a clockwise direction for magnetization reversal in a positive Z-axis direction. A torque, applied to a magnetic moment of a free layer due to in-plane current, will be referred to as a spin-orbit torque.

The magnetic tunnel junction 120 may include a reference layer 126, a free layer 122, a tunnel barrier layer 124 disposed therebetween, and a capping electrode 128 disposed on the reference layer 126.

The reference layer 126 may have a fixed magnetic moment during a write operation of the magnetic memory device. For example, the magnetic moment of the reference layer may not be switched by a spin-orbit torque generated by currents flowing through the conductive lines 112 and 114.

The free layer 122 may have a switchable magnetic moment during a write operation of the magnetic memory device. For example, the free layer 122 may have a magnetic moment switchable parallel or antiparallel to the magnetic moment of the reference layer 126.

The magnetic moment of the free layer 122 may be switched using a spin-orbit torque generated by the currents $J_x$ and $J_y$ flowing through the conductive lines 112 and 114.

Each of the reference layer 126 and the free layer 122 may have an easy axis of magnetization, substantially perpendicular to a surface thereof. For example, a surface of the reference layer 126 may be parallel to an X-Y plane. The easy axis of magnetization of the reference layer 126 may be substantially parallel to the Z axis.

Similarly, a surface of the free layer 122 may be parallel to the X-Y plane, and the easy axis of magnetization of the free layer 122 may be substantially parallel to a Z axis. However, the present disclosure is not limited thereto.

The reference layer 126 and the free layer 122 may include at least one of the material having an $L1_0$ crystal structure, a material having a hexagonal close-packed lattice (HCP), and an amorphous rare-earth transition metal (RE-TM) alloy.

The reference layer 126 and the free layer 122 may include at least one of materials having an $L1_0$ crystal structure such as $Fe_{50}Pt_{50}$, $Fe_{50}Pd_{50}$, $Co_{50}Pt_{50}$, $Co_{50}Pd_{50}$, and $Fe_{50}Ni_{50}$.

The reference layer 126 and the free layer 122 may include at least one of materials, having a hexagonal close packed lattice (HCP) such as a cobalt-platinum (CoPt) disordered alloy, in which platinum (Pt) is included in an amount of 10 at. % to 45 at. %, and a $Co_3Pt$ ordered alloy.

The reference layer 126 and the free layer 122 include at least one of amorphous RE-TM alloys including at least one selected from the group consisting of rare earth elements such as terbium (Tb), dysprosium (Dy), and gadolinium (Gd) and at least one selected from the group consisting of transition metal elements such as iron (Fe), cobalt (Co), and nickel (Ni).

The reference layer 126 and the free layer 122 may include a material having interface perpendicular magnetic anisotropy. The interface perpendicular magnetic anisotropy refers to a phenomenon in which a magnetic layer, having intrinsic horizontal magnetization characteristics, has a perpendicular magnetization direction due to an influence from an interface with another adjacent layer. The reference layer 126 and the free layer 122 may include at least one of cobalt (Co), iron (Fe), and nickel (Ni). In addition, the reference layer 126 and the free layer 122 may further include at least one of non-magnetic materials such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, the reference layer 126 and the free layer 122 may include CoFe or NiFe, and may further include boron (B). In addition, the reference layer 126 and the free layer 122 may further include at least one of titanium (Ti), aluminum (Al), silicon (Si), magnesium (Mg), tantalum (Ta), and silicon (Si).

The reference layer 126 may have a single-layer structure. According to other embodiments, unlike what is illustrated in FIG. 1, the reference layer 126 may include a synthetic antiferromagnetic material having ferromagnetic layers separated by nonmagnetic layer(s).

The tunnel barrier layer 124 may be interposed between the reference layer 126 and the free layer 122. The tunnel barrier layer 124 may include at least one of a magnesium (Mg) oxide, a titanium (Ti) oxide, an aluminum (Al) oxide, a magnesium-zinc (MgZn) oxide, a magnesium-boron (MgB) oxide, and a titanium (Ti) nitride, and a vanadium (V) nitride. For example, the tunnel barrier layer 124 may include a crystalline magnesium oxide (MgO).

A phase difference between the first current and the second current may be given depending on the magnetization direction of the free layer 122. For example, a phase difference between the first current and the second current may be 90 degrees. A first frequency f may be several hundreds of MHz to several tens of GHz. A first angular frequency ($\omega=2\pi f$) is an angular frequency of the first frequency f.

Figure 3:
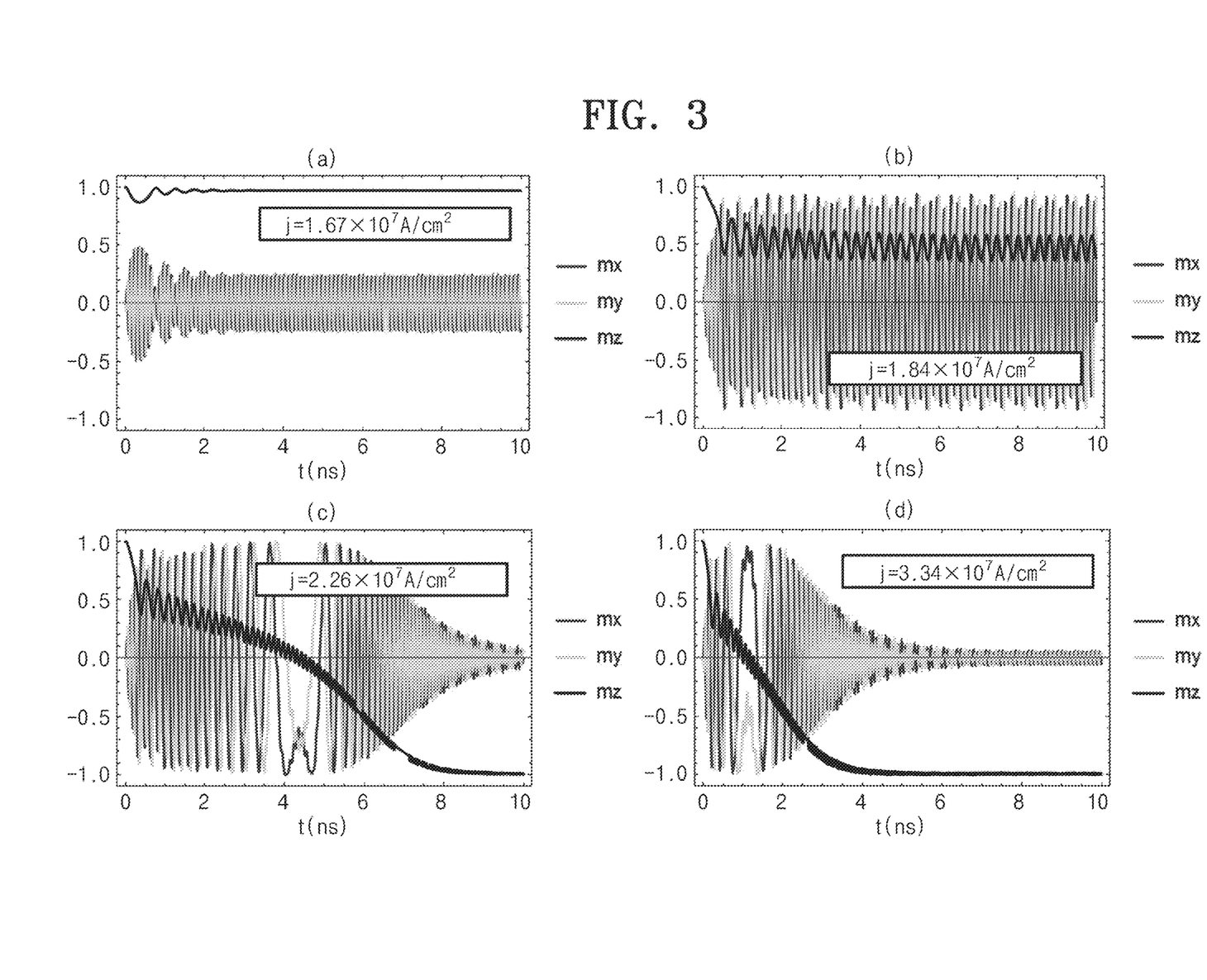
FIG. 3 shows simulation results indicating time-dependent magnetization directions of a free layer according to example embodiments of the present disclosure.

FIG. 3 shows simulation results indicating time-dependent magnetization directions of a free layer according to example embodiments of the present disclosure.

Referring to FIG. 3, when the first and second currents $J_x$ and $J_Y$ are applied, it can be confirmed that magnetization is reversed at a high speed while precessing. Switching speed may be about several nanoseconds, and switching current density j may be $2.26 \times 10^7$ A/cm$^2$ or more. The switching current density j is about 1/10 of the current density when switching to DC current. In this case, a non-adiabaticity parameter β is 1 and a constant, representing the degree of a difference between a first angular frequency ($\omega=2\pi f$) of AC current and a resonant frequency due to anisotropy, is 1.3.

Figure 4A:
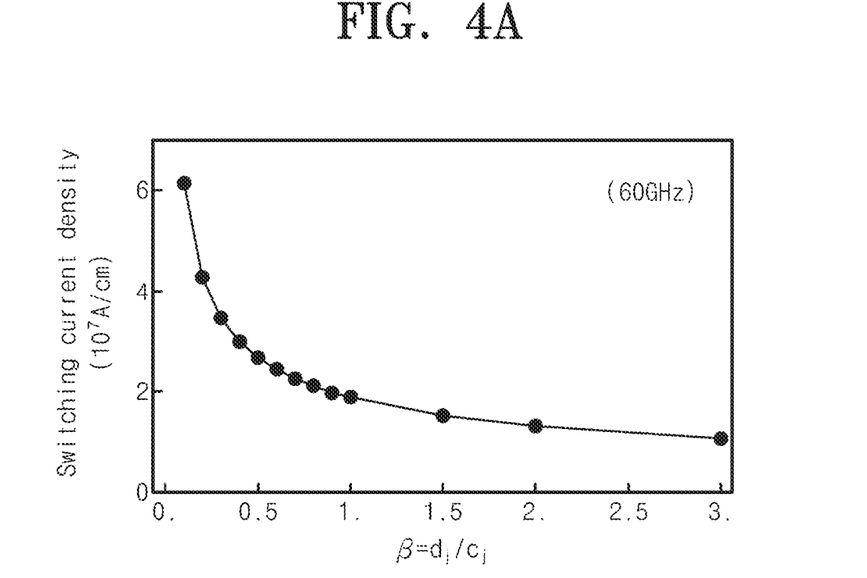
FIG. 4A shows simulation results indicating switching current density depending on a non-adiabaticity parameter.

FIG. 4A shows simulation results indicating switching current density depending on a non-adiabaticity parameter.

Figure 4B:
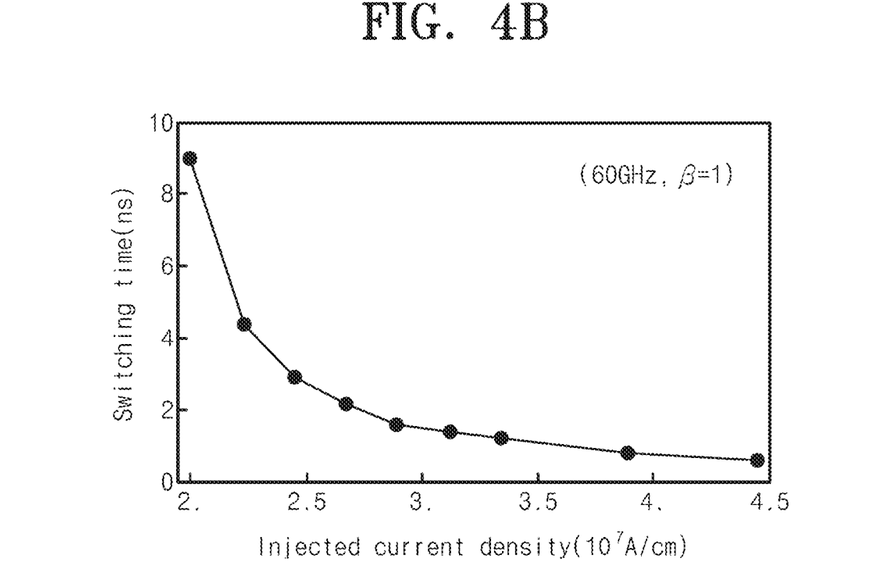
FIG. 4B shows a simulation result indicating switching time depending on the introduced current density.

FIG. 4B shows a simulation result indicating switching time depending on the introduced current density.

Figure 4C:
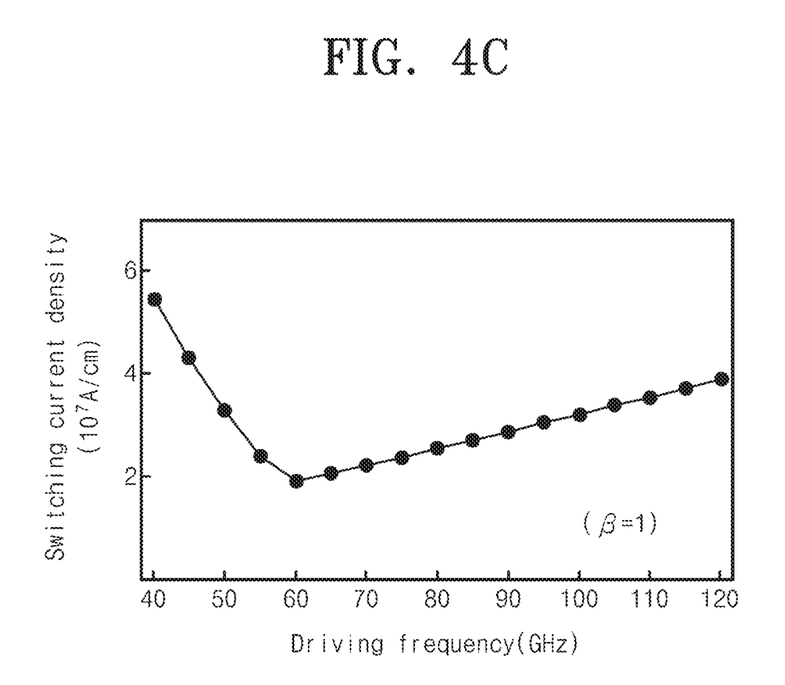
FIG. 4C shows a simulation result indicating switching current density depending on a driving angular frequency.

FIG. 4C shows a simulation result indicating switching current density depending on a driving angular frequency.

Referring to FIG. 4A, the larger a non-adiabaticity parameter β, the lower threshold current required for switching. Therefore, the non-adiabaticity parameter β may be 1 or more. An area of a free layer was $\pi \times 15^2$ nm$^2$, a thickness of the free layer was 2 nm, a perpendicular magnetic anisotropy constant $K_{eff}$ was $2.2 \times 10^6$ erg/cm$^3$, a saturation magnetization value Ms was 1000 emu/cm$^3$, and a Gilbert attenuation constant α was 0.01, a spin hall angle $\theta_{SH}$ was 0.3, and a non-adiabaticity parameter β was 0 to 3.

Referring to FIG. 4B, the switching time is decreased as injected current density is increased.

Referring to FIG. 4C, there is an optimized driving frequency at which switching current density is optimized. In this simulation, the optimized frequency is 60 GHz. The driving frequency may be several GHz to tens of GHz, in detail, 50 GHz to 70 GHz.

Figure 5A:
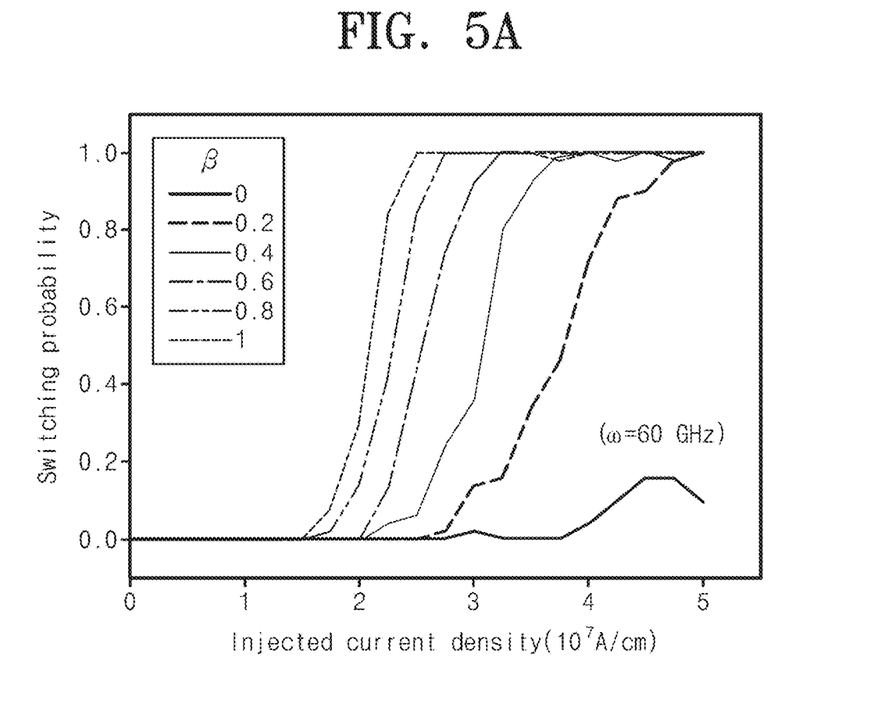
FIG. 5A shows results indicating switching probability depending on a non-adiabaticity parameter β and the introduced current density.

FIG. 5A shows results indicating switching probability depending on a non-adiabaticity parameter β and the introduced current density.

Figure 5B:
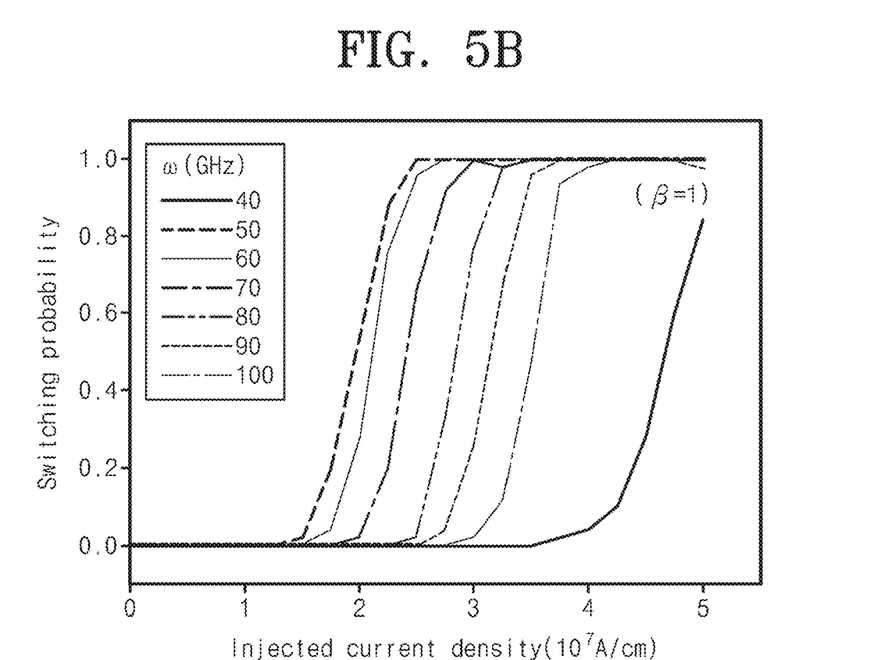
FIG. 5B shows results indicating switching probability depending on a driving frequency and the introduced current density.

FIG. 5B shows results indicating switching probability depending on a driving frequency and the introduced current density.

Referring to FIG. 5A, when a non-adiabaticity parameter β is 1 (β=1), switching occurs at the lowest injected current density.

Referring to FIG. 5B, a driving frequency is 40 GHz to 100 GHz. In the case of the driving frequency of 50 GHz, switching occurs at the lowest injected current density.

Figure 6:
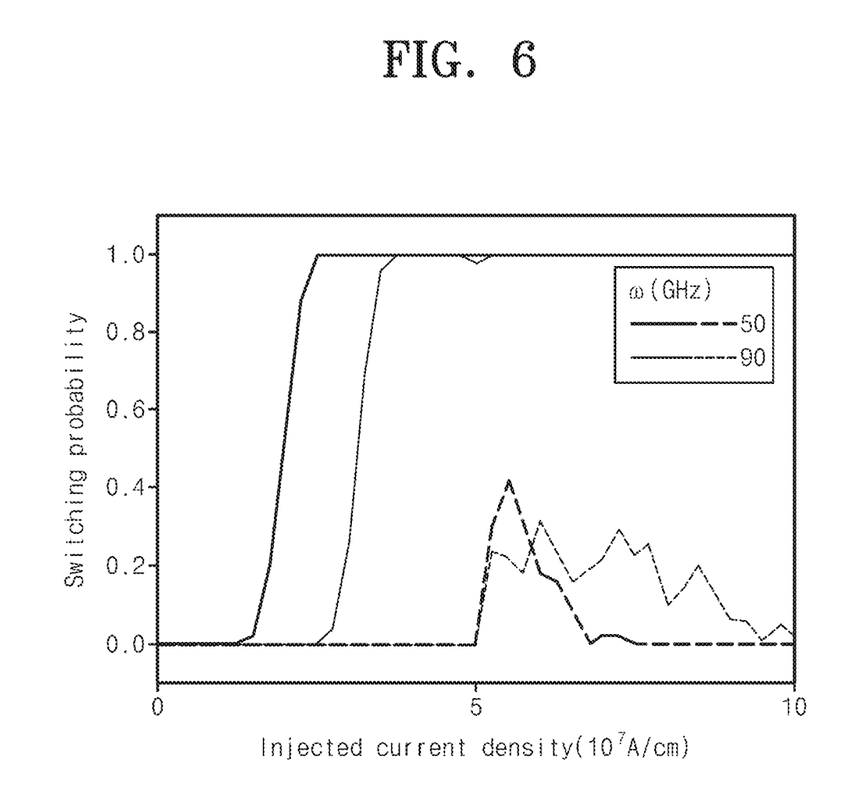
FIG. 6 shows a simulation result indicating switching probability when both the first current and second current are applied and switching probability when only the first current is applied.

FIG. 6 shows a simulation result indicating switching probability when both the first current and second current are applied and switching probability when only the first current is applied.

Referring to FIGS. 1A and 6, these results were obtained by a calculation performed 50 times at a temperature of 300K. Solid lines correspond to a case in which both the first current $j_x$ and the second current $j_y$ are applied. Dot-dash lines correspond to a case in which only the first current $j_x$ is applied. A non-adiabaticity parameter β is 1. When both the first current and the second current are applied and a driving frequency is 50 GHz, switching occurs at the lowest injected current density.

Figure 7:
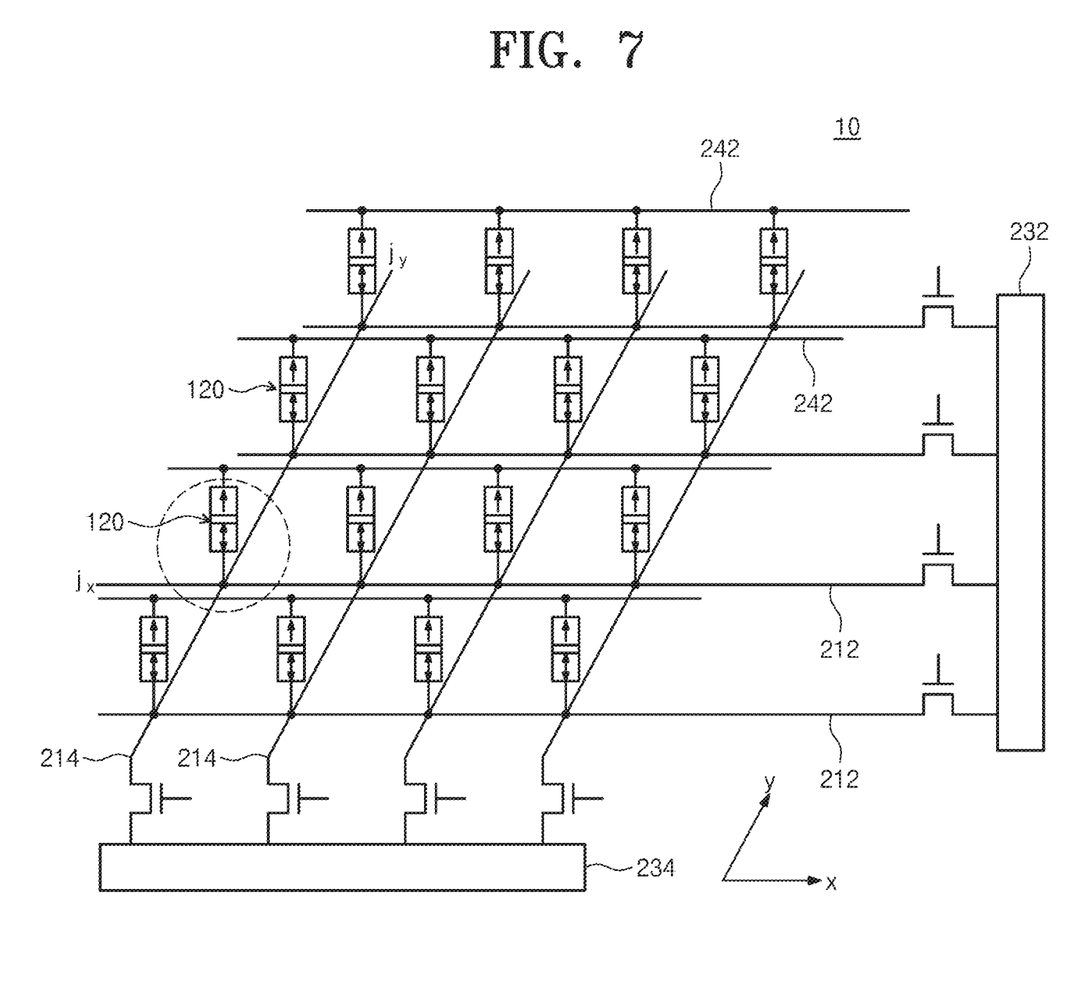
FIG. 7 is a circuit diagram of a magnetic memory according to another example embodiment of the present disclosure.

FIG. 7 is a circuit diagram of a magnetic memory according to another example embodiment of the present disclosure.

Referring to FIG. 7, a magnetic memory 10 includes a plurality of first conductive lines 212 extending in a first direction (an X-axis direction), a plurality of second conductive lines 214 extending in a second direction perpendicular to the first direction, a plurality of magnetic tunnel junction elements, each including a free layer, a reference layer, and a tunnel barrier layer disposed between the free layer and the reference layer and respectively disposed on intersections of the first conductive lines 212 and the second conductive lines 214, a first AC power supply 232 providing first AC current to the first conductive lines 212, a second AC power supply 234 providing second AC current to the second conductive lines, and bitlines 242 extending parallel to the first conductive lines and connected to the reference layers of the magnetic tunnel junction elements arranged in the first direction. The first current $j_x$ and the second current $j_y$ switch the free layer 122. The bitlines 242 are used to read a resistance state of the magnetic tunnel junction.

According to example embodiments, a switching operation of a magnetic memory device may be performed using alternating current flowing to a pair of conductive lines intersecting each other. Therefore, a magnitude of current required during a write operation of the magnetic memory device may be reduced.

Although the present disclosure and its advantages have been described in detail, it should be understood that various changes, substitutions and alterations can be made herein without departing from the spirit and scope of the disclosure as defined by the following claims.

What is claimed is:

1. A magnetization switching method of a magnetic memory comprising a magnetic tunnel junction comprising a free layer, a reference layer, and a tunnel barrier layer disposed between the free layer and the reference layer, a first conductive line, and a second conductive line,     wherein the magnetization switching method comprises:

applying AC-type first current having a first frequency to the first conductive line; and         applying AC-type second current having the first frequency to the second conductive line, wherein the free layer performs magnetization reversal using the first current and the second current,     wherein the first conductive line and the second conductive line are disposed in direct contact with the free layer, and the second conductive line is disposed to intersect the first conductive line, and     wherein the magnetic tunnel junction is disposed on an intersection of the first conductive line and the second conductive line.

2. The magnetization switching method as set forth in claim 1, wherein the first conductive line and the second conductive line are disposed in the same plane.

3. The magnetization switching method as set forth in claim 1, wherein there is a phase difference between the first current and the second current.

4. The magnetization switching method as set forth in claim 1, wherein a phase difference between the first current and the second current is given depending on a magnetization direction of the free layer.

5. The magnetization switching method as set forth in claim 1, wherein the first frequency is several hundreds of MHz to several tens of GHz.

6. The magnetization switching method as set forth in claim 1, wherein the free layer has an easy axis of magnetization, perpendicular to a surface of the free layer, to have perpendicular magnetic anisotropy.

7. The magnetization switching method as set forth in claim 1, wherein the first conductive line and the second conductive line comprise at least one selected from the group consisting of copper (Cu), tantalum (Ta), platinum (Pt), tungsten (W), gadolinium (Gd), bismuth (Bi), iridium (Ir), and combinations thereof.

8. A magnetic memory comprising:

a plurality of first conductive lines extending in a first direction;

a plurality of second conductive lines extending in a second direction perpendicular to the first direction;

a plurality of magnetic tunnel junction elements, each including a free layer, a reference layer, and a tunnel barrier layer disposed between the free layer and the reference layer and respectively disposed on intersections between the first conductive lines and the second conductive lines;

a first AC power supply providing first AC current to the first conductive lines;

a second AC power supply providing second AC current to the second conductive lines; and     bitlines extending parallel to the first conductive lines and connected to the reference layers of the magnetic tunnel junction elements arranged in the first direction,     wherein at least one of the plurality of the first conductive lines and at least one of the plurality of the second conductive line are disposed in direct contact with at least one of the free layer.

9. The magnetic memory as set forth in claim 8, wherein the first current and the second current switch the free layer.

10. The magnetization memory as set forth in claim 8, wherein the plurality of the first conductive lines and the plurality of the second conductive lines are disposed in the same plane.

11. The magnetization memory as set forth in claim 8, wherein there is a phase difference between the first AC current and the second AC current.

12. The magnetization memory as set forth in claim 8, wherein a phase difference between the first AC current and the second AC current is given depending on a magnetization direction of the free layer.

13. The magnetization memory as set forth in claim 8, wherein a frequency of the first AC current is several hundreds of MHz to several tens of GHz.

14. The magnetization memory as set forth in claim 8, wherein the free layer has an easy axis of magnetization, perpendicular to a surface of the free layer, to have perpendicular magnetic anisotropy.

15. The magnetization memory as set forth in claim 8, wherein at least one of the plurality of the first conductive lines and at least one of the plurality of the second conductive lines comprise at least one selected from the group consisting of copper (Cu), tantalum (Ta), platinum (Pt), tungsten (W), gadolinium (Gd), bismuth (Bi), iridium (Ir), and combinations thereof.

* * * * *